(12) United States Patent
Yang et al.

(10) Patent No.: US 8,476,639 B2
(45) Date of Patent: Jul. 2, 2013

(54) GROUP III NITRIDE SEMICONDUCTOR AND GROUP III NITRIDE SEMICONDUCTOR STRUCTURE

(75) Inventors: Jong In Yang, Gyunggi-do (KR); Sang Bum Lee, Gyunggi-do (KR); Sang Yeob Song, Gyunggi-do (KR); Si Hyuk Lee, Gyunggi-do (KR); Tae Hyung Kim, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/323,365

(22) Filed: Dec. 12, 2011

(65) Prior Publication Data

US 2012/0086016 A1  Apr. 12, 2012

Related U.S. Application Data

(62) Division of application No. 12/419,590, filed on Apr. 7, 2009, now Pat. No. 8,110,424.

(30) Foreign Application Priority Data

Oct. 14, 2008  (KR) .................. 10-2008-0100773

(51) Int. Cl.
*H01L 29/15* (2006.01)
(52) U.S. Cl.
USPC ............... 257/76; 438/46; 257/189; 257/201; 257/11; 257/12; 257/99; 257/200; 257/E21.387
(58) Field of Classification Search
USPC .............. 438/46; 257/76, 189, 201, 11, 12, 257/99, 183, 197, 200, E21.387; 372/44.011
See application file for complete search history.

(56) References Cited

U.S. PATENT DOCUMENTS

| | | | |
|---|---|---|---|
| 4,172,906 A | 10/1979 | Pancholy | |
| 6,559,075 B1 * | 5/2003 | Kelly et al. | 438/795 |
| 6,737,367 B1 | 5/2004 | Drechsler et al. | |
| 7,341,628 B2 | 3/2008 | Melas | |
| 7,442,569 B2 * | 10/2008 | Lee et al. | 438/47 |
| 7,815,970 B2 * | 10/2010 | Schlesser et al. | 427/255.394 |
| 7,816,284 B2 * | 10/2010 | Yang et al. | 438/795 |

(Continued)

FOREIGN PATENT DOCUMENTS

| | | |
|---|---|---|
| DE | 102 43 757 A1 | 4/2004 |
| JP | 02-014581 A | 1/1990 |

(Continued)

OTHER PUBLICATIONS

A. Yoshikawah, "Polarity selection process and polarity manipulation of GaN in MOVPE and RF-MBE growth", Thin Solid Films 412 (2002) 38-43.*

(Continued)

*Primary Examiner* — David Vu
*Assistant Examiner* — Caleb Henry
(74) *Attorney, Agent, or Firm* — McDermott Will & Emery LLP

(57) ABSTRACT

There is provided a surface treatment method of a group III nitride semiconductor including: providing a group III nitride semiconductor including a first surface having a group III polarity and a second surface opposing the first surface and having a nitrogen polarity; and irradiating a laser beam onto the second surface to change the nitrogen polarity of the second surface to the group III polarity.

12 Claims, 9 Drawing Sheets

U.S. PATENT DOCUMENTS

| | | | |
|---|---|---|---|
| 8,110,417 B2 * | 2/2012 | Yang et al. | 438/20 |
| 2003/0089906 A1 | 5/2003 | Ueda | |
| 2006/0172892 A1 | 8/2006 | Han et al. | |
| 2006/0252164 A1 * | 11/2006 | Yao et al. | 438/22 |
| 2006/0292728 A1 | 12/2006 | Ishibashi et al. | |
| 2007/0042560 A1 * | 2/2007 | Sumiya et al. | 438/400 |
| 2008/0093618 A1 | 4/2008 | Lee et al. | |
| 2008/0197452 A1 * | 8/2008 | Oshima | 257/615 |
| 2009/0085043 A1 * | 4/2009 | Song et al. | 257/76 |

FOREIGN PATENT DOCUMENTS

| | | |
|---|---|---|
| JP | 11-274557 | 10/1999 |
| JP | 2001-185487 | 7/2001 |
| JP | 2002-222773 A | 9/2002 |
| JP | 2002-270525 A | 9/2002 |
| JP | 2005-26407 A | 1/2005 |
| JP | 2006-173147 A | 6/2006 |
| JP | 2006-294697 A | 10/2006 |
| JP | 2006-294698 A | 10/2006 |
| JP | 2007-005526 A | 1/2007 |
| JP | 2007-184352 A | 7/2007 |
| JP | 2008-109090 A | 5/2008 |
| KR | 10-2003-0050849 A | 6/2003 |
| TW | I274406 B | 2/2007 |
| WO | WO 2006/124067 A1 | 11/2006 |

OTHER PUBLICATIONS

Japanese Office Action, w/ English translation thereof, issued in Japanese Patent Application No. 2009-096184, dated Sep. 13, 2011.
German Office Action, with English translation thereof, issued in German Patent Application 10 2009 019 281.6, dated Jun. 6, 2011.
Chinese Office Action, w/ English translation thereof, issued in Chinese Patent Application No. CN 200910137472.0 dated Feb. 24, 2011.
Taiwan Office Action, and English translation thereof, issued in Taiwanese Patent Application No. 98111781 dated Oct. 24, 2012.

* cited by examiner

LASER BEAM IRRADIATION

GROUP III NITRIDE SEMICONDUCTOR AND GROUP III NITRIDE SEMICONDUCTOR STRUCTURE

CROSS-REFERENCE TO RELATED APPLICATIONS

This application is a Divisional of U.S. application Ser. No. 12/419,590 filed on Apr. 7, 2009 now U.S. Pat. No. 8,110,424, which claims the priority of Korean Patent Application No. 2008-0100773 filed on Oct. 14, 2008, in the Korean Intellectual Property Office, the entire contents of each of which are hereby incorporated by reference.

BACKGROUND OF THE INVENTION

1. Field of the Invention

The present invention relates to a surface treatment method of a group III nitride semiconductor, a group III nitride semiconductor, a manufacturing method of the same and a group III nitride semiconductor structure, and more particularly, to a surface treatment method of a group III nitride semiconductor in which opposing two surfaces have identical polarity, a group III nitride semiconductor, a manufacturing method of the same and a group III nitride semiconductor structure.

2. Description of the Related Art

In general, a light emitting device formed of a group III nitride semiconductor is utilized to obtain light in a blue or green wavelength. The light emitting device is made of a semiconductor material having a composition expressed by $Al_xIn_yGa_{(1-x-y)}N$, where $0 \leq x \leq 1$, $0 \leq y \leq 1$, and $0 \leq x+y \leq 1$.

A group III nitride semiconductor can be grown on a heterogeneous substrate such as a sapphire ($\alpha$-$Al_2O_3$) substrate and a SiC substrate. Particularly, the sapphire substrate has a hexagonal structure identical to a gallium nitride. Moreover, the sapphire substrate is cheaper than the SiC substrate and stable at a high temperature, thus mainly employed as a growth substrate for the group III nitride semiconductor.

Meanwhile, the group III nitride semiconductor grown on the sapphire substrate has a Wurtzite and non-centrosymmetric crystal structure. Therefore, the group III nitride semiconductor, for example, gallium (Ga) nitride semiconductor has a gallium polarity on one surface (hereinafter gallium polarity surface) and a nitrogen (N) polarity on another surface (hereinafter nitrogen polarity surface). As described above, the two surfaces of the gallium nitride semiconductor experience physical differences in etching rate and surface recombination configuration, or defects and surface dislocation due to differences in surface polarity. These physical differences lead to differences in surface characteristics between the gallium polarity surface and the nitrogen polarity surface.

Specifically, the gallium polarity surface of the gallium nitride semiconductor exhibits a superior surface flatness than the nitrogen polarity surface. Also, the gallium polarity surface possesses better crystallinity than the nitrogen polarity surface due to low binding of materials acting as an impurity. Accordingly, when the gallium semiconductor is re-grown, a re-growth layer grown on the gallium polarity surface has a flat surface. Meanwhile, the re-growth layer grown on the nitrogen polarity surface suffers defects on a surface thereof such as hillock, column and pyramidal grain.

In the meantime, polarity differences between both surfaces of the gallium nitride semiconductor cause spontaneous polarization, thereby leading to differences in surface band bending between the gallium polarity surface and the nitrogen polarity surface.

Also, the gallium polarity surface of the gallium nitride semiconductor exhibits a low constant voltage due to low ohmic contact resistance, and possesses superior electrical characteristics than the nitrogen polarity surface. Moreover, the both surfaces of the gallium nitride semiconductor react differently to an etching solution, for example, 'KOH' owing to polarity differences. Specifically, the gallium polarity surface hardly reacts with the etching solution and the nitrogen polarity surface reacts actively with the etching surface and thus is etched significantly.

As described above, in a group III nitride semiconductor, a surface having a group III polarity shows more superb characteristics than a surface having a nitrogen polarity in terms of surface flatness, binding with impurities, re-growth characteristics, electrical characteristics and etching characteristics. Therefore, there is a call for developing a group III nitride semiconductor whose opposing two surfaces have group III polarities.

SUMMARY OF THE INVENTION

An aspect of the present invention provides a surface treatment method in which a laser beam is irradiated onto a second surface opposing a first surface with a group III polarity and having a nitrogen polarity to change the polarity of the second surface into an identical polarity to the first surface, a group III nitride semiconductor, a manufacturing method of the same and a group III nitride semiconductor structure.

According to an aspect of the present invention, there is provided a surface treatment method of a group III nitride semiconductor including: providing a group III nitride semiconductor including a first surface having a group III polarity and a second surface opposing the first surface and having a nitrogen polarity; and irradiating a laser beam onto the second surface to change the nitrogen polarity of the second surface to the group III polarity.

The surface treatment method may further include forming a crystal damage layer having a defect caused by nitrogen vacancies along the second surface, before the irradiating a laser beam onto the second surface. The forming a crystal damage layer may include performing plasma treatment or ion beam irradiation on the second surface.

The crystal damage layer may include at least one of an amorphous area, a poly-crystal area and a group III-rich area. The crystal damage layer may have a thickness of 5 to 2000 nm.

The group III nitride semiconductor may be a semiconductor represented by $Al_xIn_yGa_{(1-x-y)}N$, where $0 \leq x \leq 1$, $0 \leq y \leq 1$, and $0 \leq x+y \leq 1$.

The group III nitride semiconductor is a GaN semiconductor, and the group III polarity is a gallium polarity.

According to another aspect of the present invention, there is provided a method of manufacturing a group III nitride semiconductor, the method including: growing a group III nitride semiconductor on a nitride single crystal growth substrate—wherein the group III nitride semiconductor includes a first surface having a group III polarity and a second surface opposing the first surface, the second surface in contact with the substrate and having a nitrogen polarity; separating the group III nitride semiconductor from the nitride single crystal growth substrate; and irradiating a laser beam onto the second surface to change the nitrogen polarity of the second surface to a group III polarity.

The method may further include forming a crystal damage layer having a defect caused by nitrogen vacancies along the second surface, before the irradiating a laser beam onto the second surface. The forming a crystal damage layer may include performing plasma treatment or ion beam irradiation onto the second surface.

The crystal damage layer may include at least one of an amorphous area, a poly-crystal area and a group III-rich area. The crystal damage layer may have a thickness of 5 to 2000 nm.

The group III nitride semiconductor may be a semiconductor represented by $Al_xIn_yGa_{(1-x-y)}N$, where $0 \leq x \leq 1$, $0 \leq y \leq 1$, and $0 \leq x+y \leq 1$. The group III nitride semiconductor may be a GaN semiconductor, and the group III polarity is a gallium polarity.

The method may further include growing an additional nitride semiconductor layer on the second surface changed to have the group III polarity.

The nitride single crystal growth substrate may be formed of a material selected from a group consisting of sapphire, SiC, Si, ZnO, $MgAl_2O_4$, MgO, $LiAlO_2$ and $LiGaO_2$.

According to still another aspect of the present invention, there is provided a group III nitride semiconductor including a first surface having a group III polarity and a second surface opposing the first surface, the group III nitride semiconductor including: a polarity inversion layer corresponding to an area of the group III nitride semiconductor layer located along the second surface, and formed continuously with the other area of the group III nitride semiconductor layer, the polarity inversion layer having a crystal arrangement of the other area inversed such that the second surface has a group III polarity identical to a polarity of the first surface. The polarity inversion layer may have a thickness of 5 to 2000 nM.

The area corresponding to the polarity inversion layer may have a composition identical to a composition of the other area.

The group III nitride semiconductor may be a semiconductor represented by $Al_xIn_yGa_{(1-x-y)}N$, where $0 \leq x \leq 1$, $0 \leq y \leq 1$, and $0x+y \leq 1$.

The group III nitride semiconductor may be a GaN semiconductor, and the group III polarity may be a gallium polarity.

According to yet another aspect of the present invention, there is provided a group III nitride semiconductor structure including: a first group III nitride semiconductor including a first surface having a group III polarity and a second surface opposing the first surface; and a second group III nitride semiconductor formed on the second surface of the first group III nitride semiconductor, wherein the first group III nitride semiconductor includes a polarity inversion layer corresponding to an area of the first group III nitride semiconductor layer located along the second surface, and formed continuously with the other area of the first group III nitride semiconductor, the polarity inversion layer having a crystal arrangement of the other area inversed such that the second surface has a group III polarity identical to a polarity of the first surface. The polarity inversion layer may have a thickness of 5 to 2000 nm.

The area corresponding to the polarity inversion layer may have a composition identical to a composition of the other area of the first group III nitride semiconductor.

The second group III nitride semiconductor may have a composition different from a composition of the first group III nitride semiconductor or a conductivity type different from a conductivity type of the first group III nitride semiconductor.

The second group III nitride semiconductor may include a plurality of group III nitride semiconductor layers each including an active layer, and the group III nitride semiconductor structure includes a semiconductor light emitting device.

The first group III nitride semiconductor may be a semiconductor represented by $Al_xIn_yGa_{(1-x-y)}N$, where $0 \leq x \leq 1$, $0 \leq y \leq 1$, and $0 \leq x+y \leq 1$.

The first group III nitride semiconductor may be a GaN semiconductor, and the group III polarity may be a gallium polarity.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
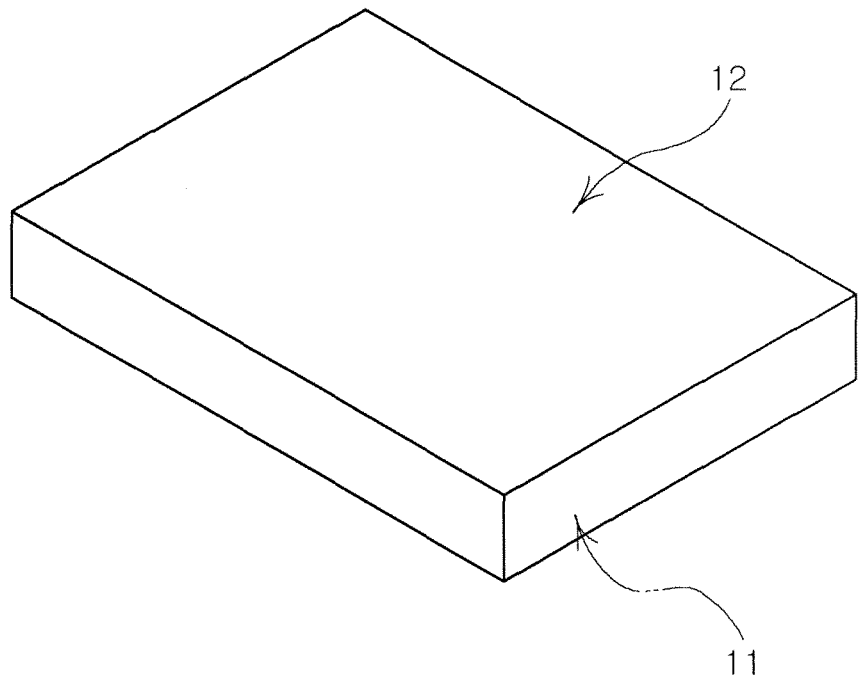
FIGS. 1A to 1D illustrate a surface treatment method of a group III nitride semiconductor according to an exemplary embodiment of the invention.

FIGS. 1A to 1D illustrate a surface treatment method of a group III nitride semiconductor according to an exemplary embodiment of the invention. First, as shown in FIG. 1A, a group III nitride semiconductor 10 is provided. Here, the group III nitride semiconductor 10 may be a single crystal layer substrate having a semiconductor composition expressed by $Al_xIn_yGa_{(1-x-y)}N$, where $0 \leq x \leq 1$, $0 \leq y \leq 1$, and $0 \leq x+y \leq 1$. The group III nitride semiconductor 10 maybe a single crystal substrate having a GaN semiconductor composition.

Also, the group III nitride semiconductor 10 includes a first surface 11 having a group III polarity and a second surface 12 opposing the first surface and having a nitrogen polarity. Specifically, in the group III nitride semiconductor, group III elements and nitrogen elements have a Wurtzite crystal structure. The group III elements are arranged on the first surface 11 and the nitrogen elements are arranged on the second surface 12. That is, the first surface 11 and the second surface 12 have polarities according to the elements arranged thereon, respectively.

Hereinafter, a surface treatment process in which the second surface 12 is changed from a nitrogen polarity to a group III polarity will be described in detail.

Figure 1B:
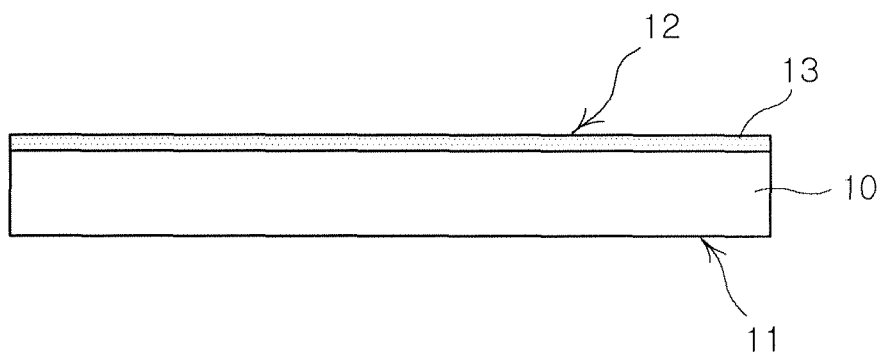

Referring to FIG. 1B, a crystal damage layer 13 with defects caused by nitrogen vacancies is formed on the second surface 12. Here, the crystal damage layer 13 may be one of an amorphous area, a poly-crystal area and a group III-rich area.

The second surface 12 can be formed by performing plasma treatment or ion beam irradiation.

As described above, when the second surface 12 is plasma-treated or irradiated with ion beam, nitrogen vacancies are generated in a layer reaching a certain thickness from the second surface 12 to thereby form a crystal damage layer 13 where the group III elements and the nitrogen elements are arranged irregularly. The crystal damage layer 13 may be formed to a thickness of 5 to 2000 nm from the second surface 12.

Figure 1C:
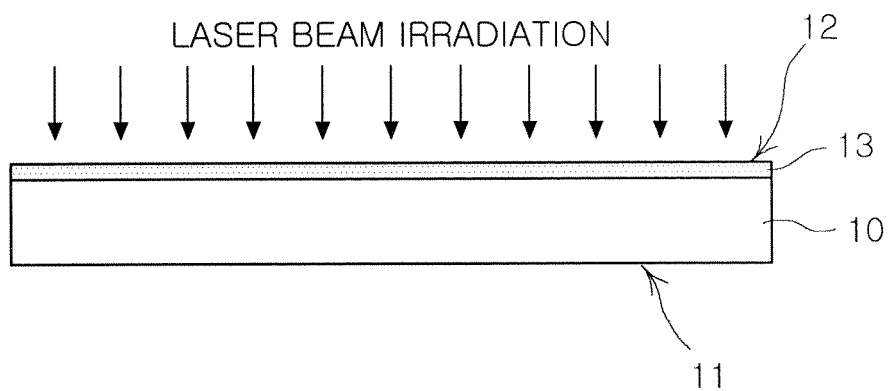

Thereafter, as shown in FIG. 1C, a laser beam is irradiated to change a polarity of the second surface 12 into a group III polarity. Specifically, a laser beam is irradiated onto the crystal damage layer 13 reaching a certain thickness from the second surface 12. Then, the group III elements and nitrogen elements arranged randomly on the crystal damage layer 13 are re-crystallized. Accordingly, this changes a crystal arrangement of the group III elements and nitrogen elements in the crystal damage layer 13, thus allowing the group III elements, not nitrogen elements to be arranged on the second surface 12. That is, the second surface 12 is changed to have a group III polarity. This is because the group III elements are arranged more stably on the surface than the nitrogen elements. Therefore, the second surface 12 has a group III polarity with a relatively stable crystal structure during re-crystallization of the group III elements and nitrogen elements.

Figure 1D:
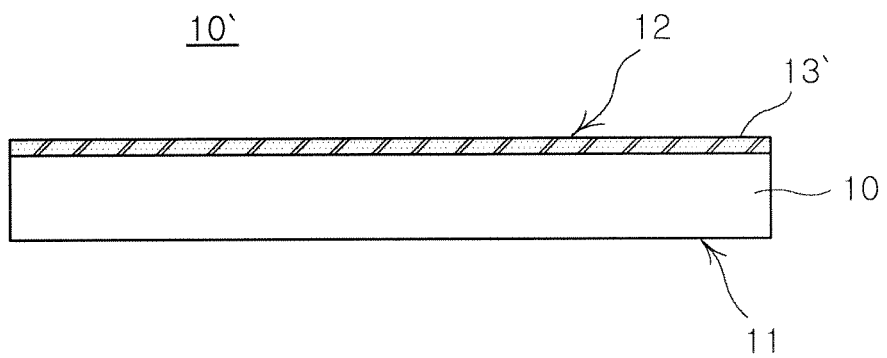

The processes described above produce a group III nitride semiconductor 10' as shown in FIG. 1D. Specifically, the group III nitride semiconductor 10' shown in FIG. 1D includes a first surface 11 having a group III polarity and a second surface 12 opposing the first surface 11 and having a group III polarity. Also, the group III nitride semiconductor 10' includes a polarity inversion layer 13'.

The polarity inversion layer 13' corresponds to an area of the group III nitride semiconductor 10' located along the second surface 12. The polarity inversion layer 13' is not formed separately from the group III nitride semiconductor 10' but formed to be continuous with the other area of the group III nitride semiconductor 10'.

As described above, the group III nitride semiconductor 10' shown in FIG. 1D may be structured such that the first surface 11 and the second surface opposite to each other with respect to the polarity inversion layer 13' have an identical group III polarity.

Figure 2A:
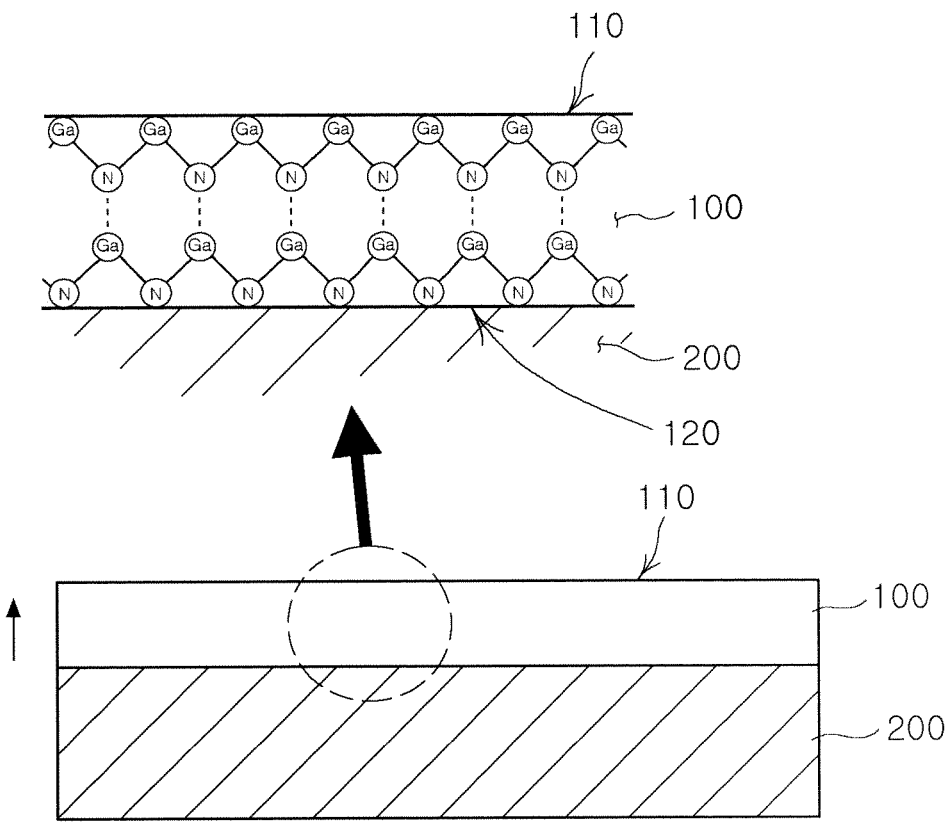
FIGS. 2A to 2E illustrate a method of manufacturing a group III nitride semiconductor according to an exemplary embodiment of the invention.

FIGS. 2A to 2E illustrate a method of manufacturing a group III nitride semiconductor according to an exemplary embodiment of the invention. Referring to FIG. 2A, the group III nitride semiconductor 100 is grown on a nitride single crystal growth substrate 200 in an arrow direction. Here, the nitride single crystal growth substrate 200 may be formed of a material selected from a group consisting of sapphire, SiC, Si, ZnO, $MgAl_2O_4$, MgO, $LiAlO_2$ and $LiGaO_2$. Also, the group III nitride semiconductor 100 may be formed on the substrate 200 by one of metal-organic chemical vapor deposition (MOCVD), hydride vapor phase epitaxy (HVPE), and molecular beam epitaxy (MBE).

The group III nitride semiconductor 100 grown in FIG. 2A may have a composition expressed by $Al_xIn_yGa_{(1-x-y)}N$, where $0 \leq x \leq 1$, $0 \leq y \leq 1$, and $0 \leq x+y \leq 1$. Therefore, the group III nitride semiconductor 100 has a crystal structure in which at least one group III element out of aluminum (Al), indium (In) and gallium(Ga) and a nitride element are bound together at a uniform interval. Moreover, the group III nitride semiconductor 100 may have a GaN semiconductor composition containing the gallium element and the nitride element.

Meanwhile, the group III nitride semiconductor 100 grown as in FIG. 2A includes a first surface 110 and a second surface 120 in contact with the nitride single crystal growth substrate 200 and opposing the first surface 110. Here, the first surface 110 has group III elements arranged thereon and thus has a group III polarity. The second surface 120 has nitrogen elements arranged thereon and thus has a nitrogen polarity.

More specifically, the first surface 110 and the second surface 120 of the group III nitride semiconductor 100 have a crystal structure such that gallium elements as the group III element and nitrogen elements are arranged periodically. At this time, the first surface 110 of the group III nitride semiconductor 100 has the gallium elements arranged thereon, thus exhibiting a gallium polarity. Meanwhile, the second surface 120 in contact with the nitride single crystal substrate 200 has the nitrogen elements arranged thereon, thus showing a nitrogen polarity.

Figure 2B:
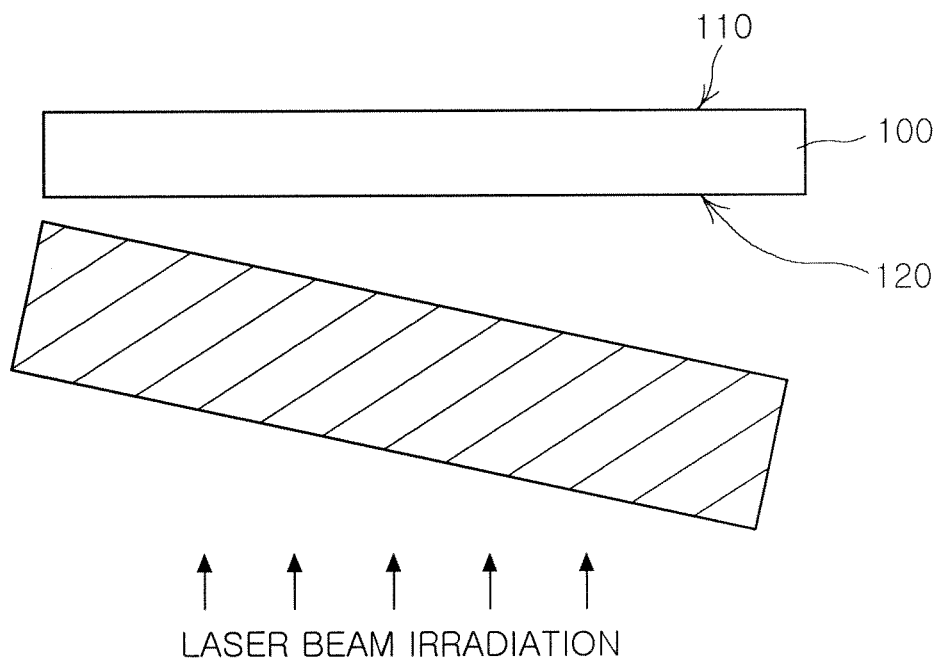

Thereafter, when the group III nitride semiconductor 100 is grown, as shown in FIG. 2B, a laser beam is irradiated onto the nitride single crystal growth substrate 200 to separate the group III nitride semiconductor 100 from the nitride single crystal growth substrate 200. Accordingly, this exposes the second surface 120 of the group III nitride semiconductor 100 where the nitride single crystal growth substrate 200 is bonded.

Figure 2C:
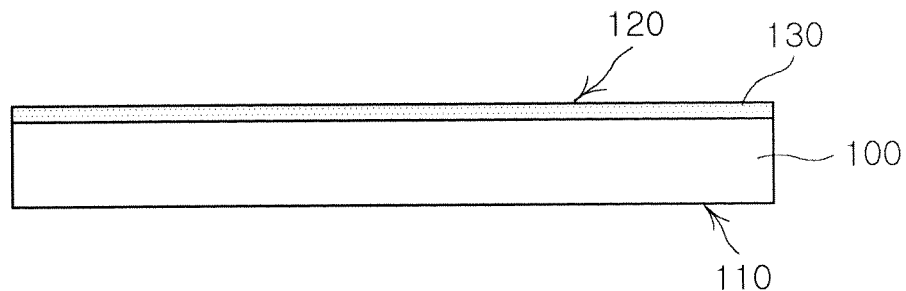
Figure 2D:
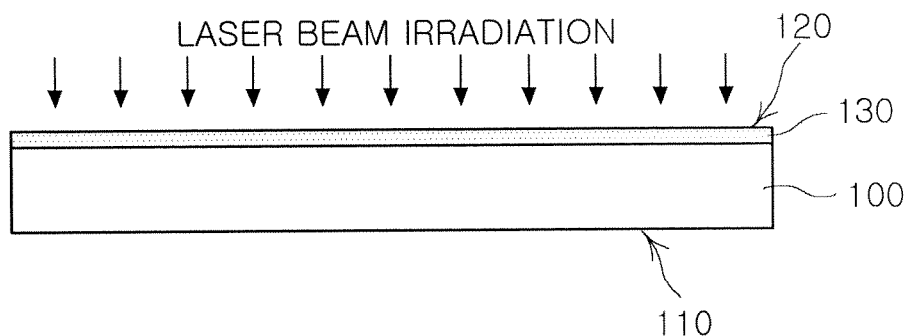

Next, the processes shown in FIGS. 2C and 2D are employed to change a polarity of the second surface 120 of the group III nitride semiconductor 100. For convenience of description, FIGS. 2C and 2D illustrate the group III nitride semiconductor 100 of FIG. 2B that is rotated such that the second surface 120 faces upward.

As shown in FIG. 2C, the crystal damage layer 130 is formed on the second surface 120 of the group III nitride semiconductor 100. Here, the crystal damage layer 130 includes defects caused by nitrogen vacancies and has a crystal structure where group III elements and nitrogen elements are randomly arranged. That is, the crystal damage layer 130 may be at least one of an amorphous area, a poly-crystal area and a group III-rich area.

The crystal damage layer 130 may be formed on the second surface 120 by performing plasma treatment or ion beam irradiation. The crystal damage layer 130 may have a thickness of 5 to 2000 nm by adjusting time and condition of the plasma treatment or ion beam irradiation.

Afterwards, as shown in FIG. 2D, a laser beam is irradiated onto the crystal damage layer 130 to change the nitrogen polarity of the second surface 120 to a group III polarity. Specifically, laser beam irradiation re-crystallizes the group III elements and nitrogen elements arranged randomly on the crystal damage layer 130. Accordingly, this allows the group III elements and nitrogen elements in the crystal damage layer 130 to be re-arranged and the group III elements to be arranged on the second surface 120. That is, the second surface 120 is changed to have the group III polarity.

Referring to FIG. 2D, a laser utilized to re-arrange the group III elements and nitrogen elements in the crystal damage layer 130 may employ a 193 nM excimer laser, a 248 nM excimer laser, a 308 nm excimer laser, a Nd: YAG laser, a He—Ne laser, and an Ar ion laser.

Meanwhile, to re-arrange the group III elements and nitrogen elements in the crystal damage layer 130, in addition to the laser beam irradiation, a predetermined heat may be applied to the crystal damage layer 130 using ion beam or annealing to allow the group III elements and nitrogen elements to be re-arranged.

Figure 2E:
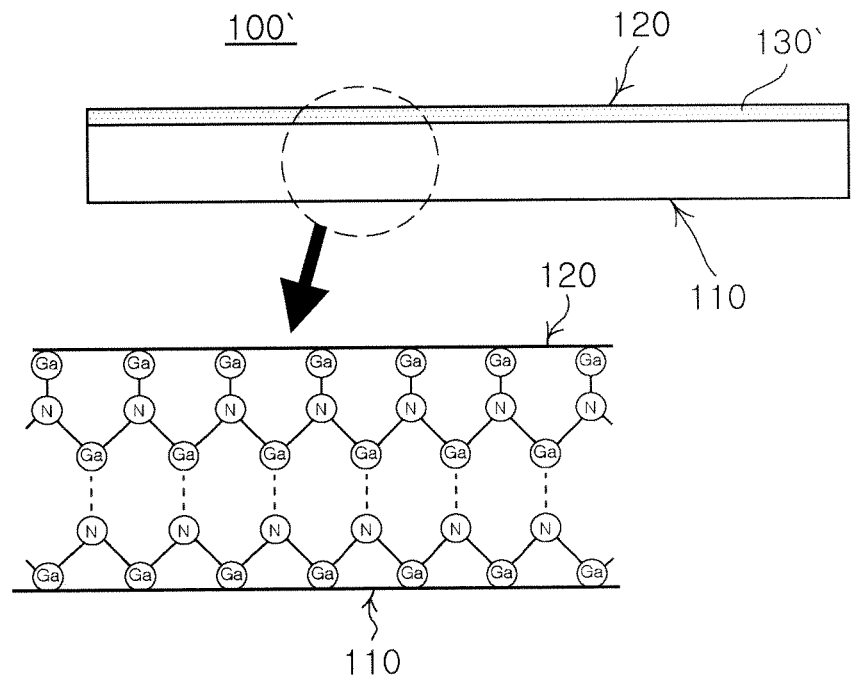

The processes shown in FIGS. 2A to 2D can produce a group III nitride semiconductor 100' shown in FIG. 2E. Specifically, the group III nitride semiconductor 100' shown in FIG. 2E includes a first surface 110 having a group III polarity, a second surface 120 opposing the first surface 110 and having a group III polarity and a polarity inversion layer 130' formed to a certain thickness from the second surface 120.

The polarity inversion layer 130' of FIG. 2E corresponds to an area of the group III nitride semiconductor 100' located along the second surface 120. That is, the polarity inversion layer 130' is not formed separately from the group III nitride semiconductor 100' but formed to be continuous with the group III nitride semiconductor 100' through a single growth process of the group III nitride semiconductor as shown in FIG. 2A, and thus is continuous with the other area. Here, the other area may cover an area from an area opposing the second surface 120, i.e., the first surface 110 to a boundary of the polarity inversion layer 130'.

Furthermore, the polarity inversion layer 130' may have a crystal arrangement of the other area inversed such that the second surface 120 has a group III polarity identical to a polarity of the first surface 110. That is, the polarity inversion layer 130' is re-crystallized such that the group III elements and nitrogen elements of the crystal damage layer 130 shown in FIGS. 2C and 2D are inversed in crystal arrangement. This polarity inversion layer 130' may have a thickness of 5 to 2000 nM.

Meanwhile, the group III nitride semiconductor 100' is re-crystallized with the second surface 120 of the group III nitride semiconductor 100' of FIG. 2E as a growth surface, thereby producing a group III nitride semiconductor structure having crystallinity and surface flatness. This will be described in detail hereafter.

Figure 3:
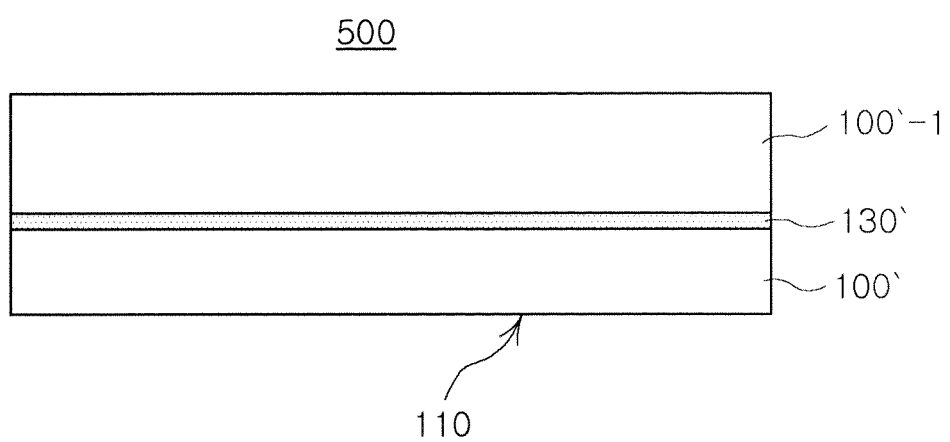
FIG. 3 illustrates a group III nitride semiconductor structure according to an exemplary embodiment of the invention.

FIG. 3 illustrates a group III nitride semiconductor structure according to an exemplary embodiment of the invention. Referring to FIG. 3, the group III nitride semiconductor structure 500 includes a first group III nitride semiconductor 100' and a second group III nitride semiconductor 100'-1.

The first group III nitride semiconductor 100' is identical to the group III nitride semiconductor 100' shown in FIG. 2E. The first group III nitride semiconductor 100' includes a first surface 110 having a group III polarity and a second surface 120 opposing the first surface 110. Also, the first group III nitride semiconductor 100' includes a polarity inversion layer 130' corresponding to an area located along the second surface 120 and having a crystal arrangement of the other area inversed such that the second surface 120 has a polarity identical to a polarity of the first surface 110.

The second group III nitride semiconductor 100'-1 is formed on the second surface 120 of the first group III nitride semiconductor 100'. Here, the second group III nitride semiconductor 100'-1 may be formed by one of metal organic chemical vapor deposition (MOCVD), hydride vapor phase epitaxy (HVPE) and molecular beam epitaxy (MBE). Also, the second group III nitride semiconductor 100'-1 may have a semiconductor composition identical to or different from the first group III nitride semiconductor 100'.

As described above, the second group III nitride semiconductor 100'-1 is formed on the second surface 120 having a group III polarity, and thus is reduced in defects such as hillock, column and pyramidal grain. Accordingly, when compared with a case where the second group III nitride semiconductor 100'-1 is grown on the surface having a nitrogen polarity, the second group III nitride semiconductor 100'-1 is improved in crystallinity and surface flatness.

Meanwhile, referring to FIG. 3, the second group III nitride semiconductor 100'-1 is illustrated as a single layer but maybe a plurality of group III nitride semiconductor layers each including an active layer. That is, the plurality of group III nitride semiconductor layers are grown on the second surface 120 of the first group III nitride semiconductor 100' to produce a semiconductor light emitting device. Here, the semiconductor light emitting device manufactured using the second surface 120 having the group III polarity is superior in crystallinity and thus increased in light emitting efficiency.

Figure 4:
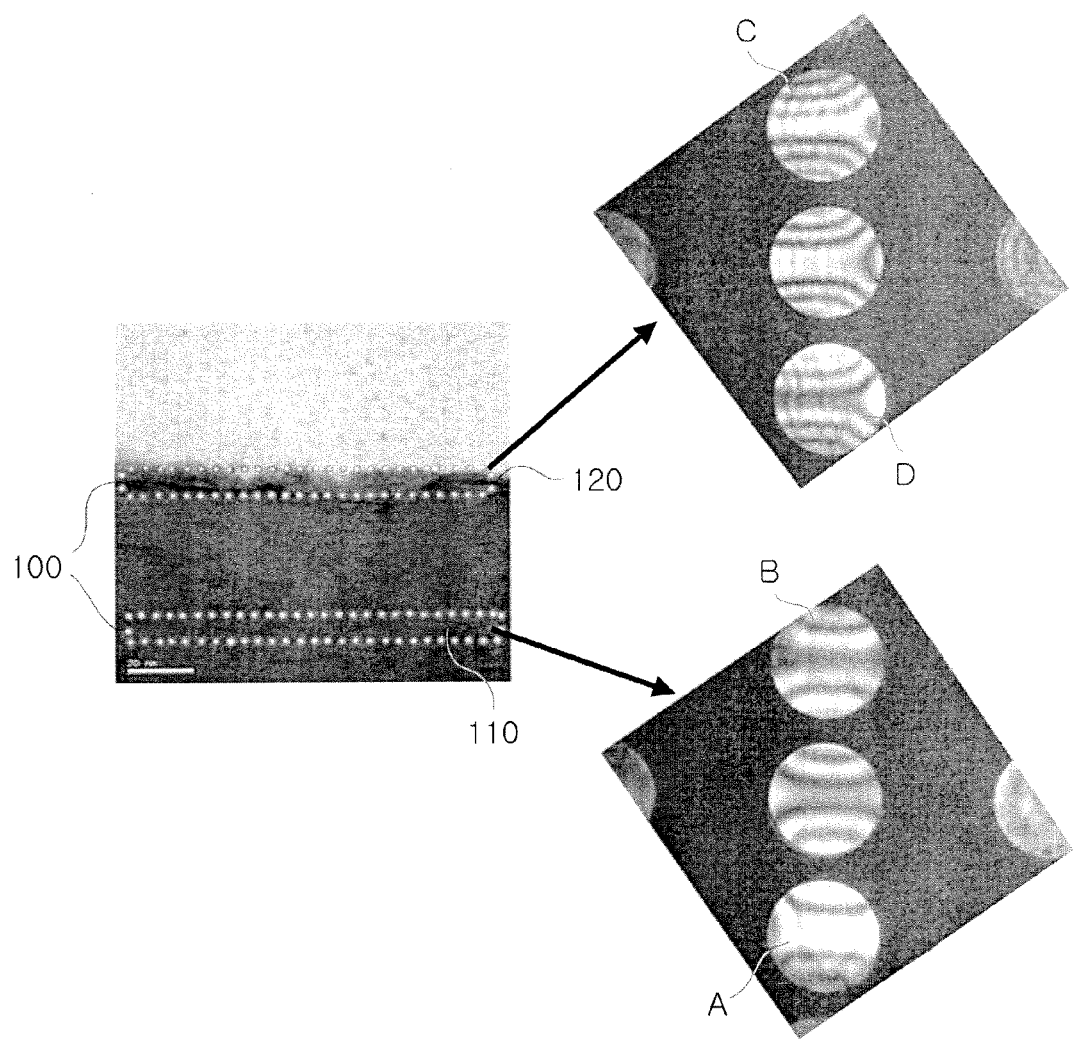
FIG. 4 is a photograph illustrating a group III nitride semiconductor manufactured by the method shown in FIGS. 2A to 2E.

FIG. 4 is a photograph illustrating a group III nitride semiconductor manufactured by the method shown in FIGS. 2A to 2E. Specifically, FIG. 4 is a cross-section obtained by vertically cutting and photographing a group III nitride semiconductor 100'. That is, FIG. 4 illustrates a crystal arrangement of a first surface 110 which is a bottom surface of the group III nitride semiconductor and a second surface 120 which is a top surface of the group III nitride semiconductor.

The group III nitride semiconductor 100' is a GaN semiconductor and both the first surface 110 and the second surface 120 have a gallium polarity. Here, the second surface 120 is a layer having a gallium polarity due to a polarity inversion layer 130' having a polarity inversed by crystal re-arrangement of gallium elements and nitrogen elements.

Meanwhile, referring to the crystal arrangement shown in FIG. 4, an A portion represents polarity of the first surface 110 and a C portion represents polarity of the second surface 120. Moreover, a B portion and a D portion represent polarities bound with corresponding polarities of the A portion and the C portion, respectively.

First, it is observed that the A portion and C portion corresponding to both surfaces of the group III nitride semiconductor 100' have (0002) plane indicating a gallium polarity. That is, the gallium polarity is formed toward the opposing two surfaces of the group III nitride semiconductor 100'. Also, the B portion and the D portion have (000-2) plane indicating a nitrogen polarity. That is, the group III nitride semiconductor 100' has a crystal arrangement in which the gallium polarity and the nitrogen polarity are combined together. But the first surface 110 and the second surface 120 exhibit a gallium polarity.

Figure 5:
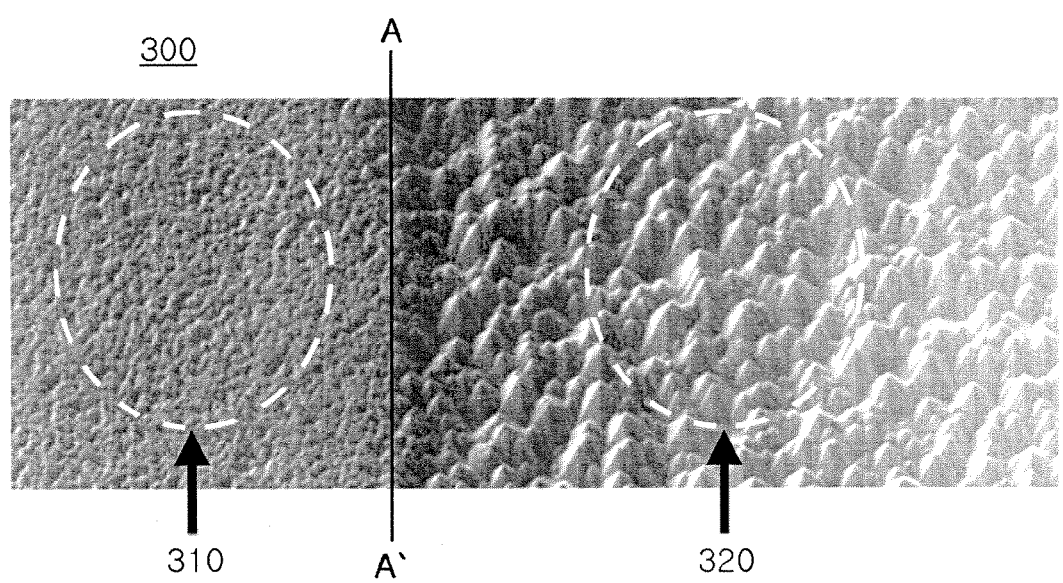
FIG. 5 is a photograph illustrating a group III nitride semiconductor having one surface etched according to an exemplary embodiment of the invention.

FIG. 5 is a photograph illustrating a group III nitride semiconductor having one surface etched according to an exemplary embodiment of the invention. Specifically, the nitride semiconductor 300 shown in FIG. 5 is a GaN semiconductor and a first area 310 located left from the A-A' line is a surface-treated area using the method of FIGS. 1B and 1C, that is, an area obtained by etching a gallium polarity area through polarity inversion. Meanwhile, a second area 320 located in the right side is an area which is not surface-treated and obtained by etching a nitrogen polarity area.

The group III nitride semiconductor 300 is etched under identical conditions, for example, etching temperature and etching time, using a KOH etching solution. As a result, the first area 310 with a gallium polarity is hardly etched and the second area 320 with a nitrogen polarity has a surface etched to form an irregular rough structure. As described above, it is clearly shown that the polarity of the first area 310 is changed to the gallium polarity by etching the first area 310 and the second area 320.

Figure 6:
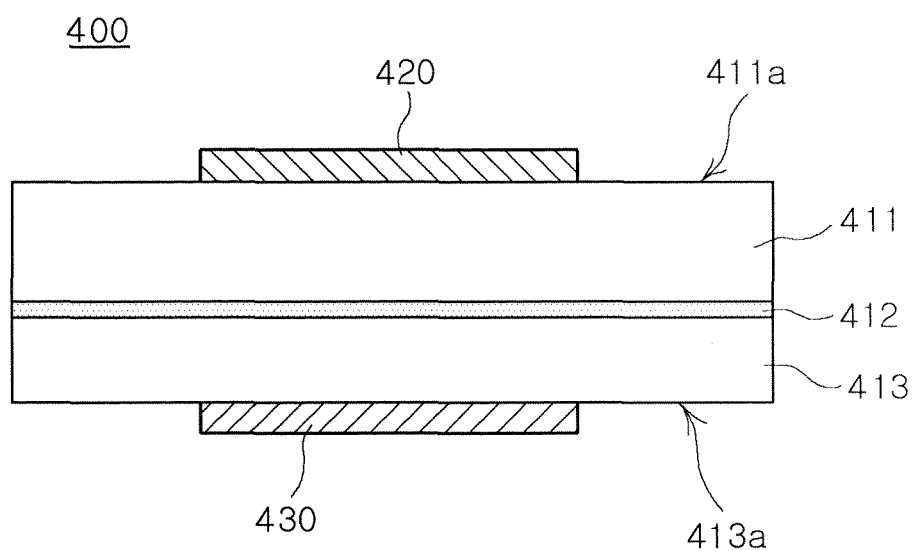
FIG. 6 illustrates a group III nitride semiconductor light emitting device according to an exemplary embodiment of the invention.

FIG. 6 illustrates a group III nitride semiconductor light emitting device according to an exemplary embodiment of the invention.

The group III nitride semiconductor 400 shown in FIG. 6 is a GaN semiconductor and includes a light emitting structure having a first GaN semiconductor layer 411, an active layer 412 and a second GaN semiconductor layer 413. The group III nitride semiconductor 400 includes a first electrode 420 in contact with the first GaN semiconductor layer 411 and a second electrode 430 formed on the second GaN semiconductor layer 413 and has a vertical structure. Here, both surfaces of the light emitting structure, i.e., one surface of the first GaN semiconductor layer 411 and one surface of the second GaN semiconductor layer 413 have a gallium polarity. That is, the first electrode 420 and the second electrode 430 are formed on the light emitting structure having a gallium polarity.

The group III nitride semiconductor 400 shown in FIG. 6 can be manufactured as follows. First, the first GaN semiconductor layer 411, the active layer 412 and the second GaN semiconductor layer 413 are sequentially stacked on a nitride single crystal substrate such as a sapphire substrate to form the light emitting structure. Also, the second electrode 430 is formed on the second GaN semiconductor layer 413. Moreover, although not shown, a conductive support substrate may be further provided on the second electrode 430 to support the light emitting structure.

Thereafter, the light emitting structure is separated from the nitride single crystal substrate by general laser lift-off. In this light emitting structure, a surface 411a of the first GaN semiconductor layer 411 bonded to the nitride single crystal growth substrate may have a nitrogen polarity and a surface 413a of the second GaN semiconductor layer 413 located in an uppermost part may have a gallium polarity. That is, the two opposing surfaces of the light emitting structure have different polarities from each other.

To ensure that the both surfaces of this light emitting structure have a gallium polarity, the surface 411a of the first GaN semiconductor layer 411 having a nitrogen polarity is surface-treated. Specifically, as shown in FIGS. 1B and 1C, a crystal damage layer is formed on the surface 411a of the first GaN semiconductor layer 411 and then a laser beam is irradiated thereonto so that the surface 411a is inversed in polarity to have a gallium polarity.

Thereafter, the first electrode 420 is formed on the surface 411a of the first GaN semiconductor layer 411 having a gallium polarity to produce a group III nitride semiconductor light emitting device 400 shown in FIG. 6. At this time, an entire portion of the surface 411a of the first GaN semiconductor layer 411 may have a gallium polarity. Alternatively, only a portion of the surface 411a where the first electrode 420 is to be formed may have a gallium polarity.

Here, the surface 411a of the first GaN semiconductor layer 411 has a crystal arrangement having both a gallium polarity and a nitrogen polarity.

The light emitting structure shown in FIG. 6 include the two surfaces 411a and 413a having a gallium polarity. The light emitting structure is improved in spontaneous polarization caused by polarity differences between the two surfaces. Accordingly, surface band bending characteristics are shown similarly at the both surfaces having a gallium polarity. Also, the light emitting structure is low in ohmic contact resistance to reduce constant voltage and leakage current. This leads to improvement in electrical properties of the nitride semiconductor light emitting device 400. This will be described in detail hereinafter.

Figure 7:
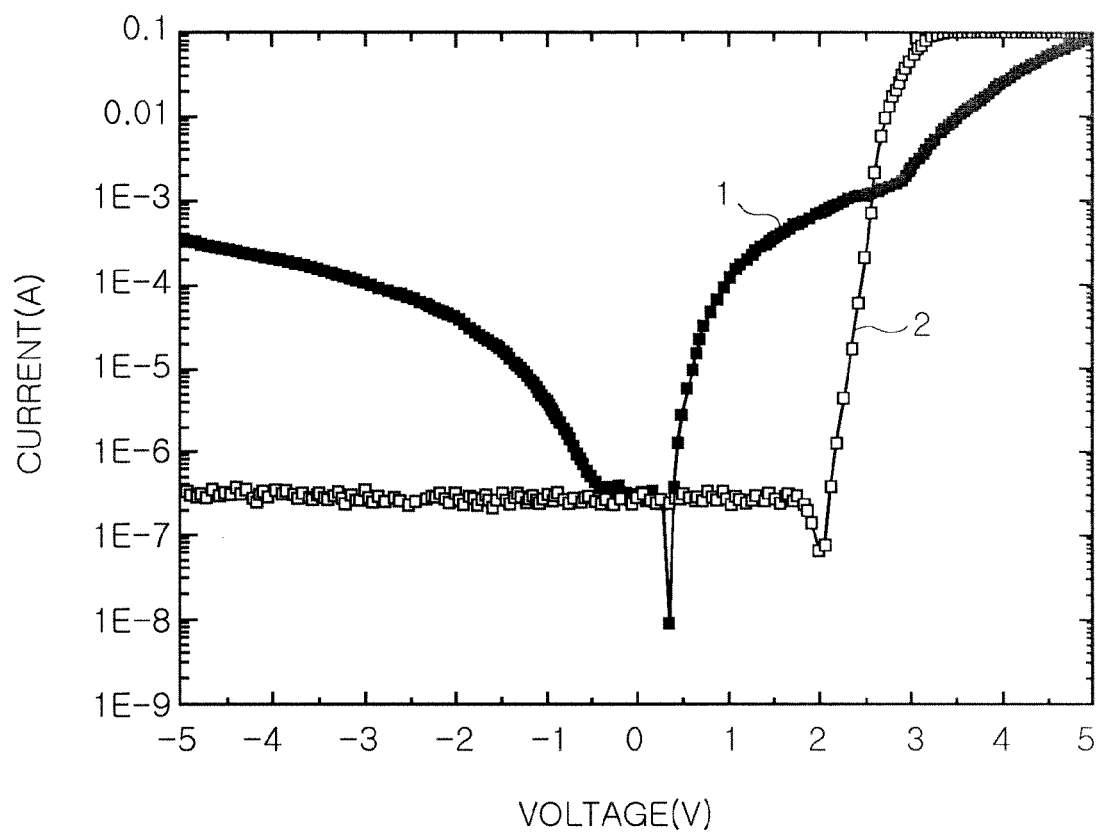
FIG. 7 is a graph illustrating characteristics of a group III nitride semiconductor device shown in FIG. 6.

FIG. 7 is a graph illustrating current-voltage characteristics of a group III nitride semiconductor device shown in FIG. 6. Referring to FIG. 7, a first graph 1 illustrates current-voltage characteristics of a group III nitride semiconductor light emitting device manufactured by a conventional method. A second graph 2 illustrates current-voltage characteristics of the group III nitride semiconductor light emitting device 400 shown in FIG. 6. Specifically, the first graph 1 and the second graph 2 each illustrate a measurement of a current changing in response to a voltage after applying the voltage to the light emitting device.

In the art, an ideal current-voltage of the semiconductor light emitting device has non-linear characteristics. That is, a very low current flows at a negative voltage and a weak positive voltage and a current increases rapidly at a predetermined level of voltage (about 0.7V or more).

Meanwhile, the general group III nitride semiconductor light emitting device having voltage-current characteristics shown in the first graph (1) is structured identically to the group III nitride semiconductor light emitting device 400 shown in FIG. 6, but a light emitting structure of the general light emitting device has different polarities on both surfaces thereof. That is, one surface of the light emitting structure has a gallium polarity and another surface opposing the one surface has a nitrogen polarity. Here, in the light emitting structure, an electrode formed on the another surface with a nitrogen polarity is high in ohmic contact resistance to thereby generate constant voltage and leakage current. Accordingly, the general group III nitride semiconductor light emitting device has current-voltage characteristics such that a low current flows only in a voltage range of −0.5 to 0.5V as in the first graph 1 and a high current flows in the other voltage range, thereby generating a leakage current.

Meanwhile, the group III nitride semiconductor light emitting device 400 of FIG. 6 has non-linear current-voltage characteristics such that as in a second graph (2), a low current flows at a negative voltage and a current rapidly increases in a voltage range of 1 to 2V. This is similar to ideal current-voltage characteristics. Therefore, the group III nitride semiconductor light emitting device of the present invention allows a constant voltage and leakage current to be reduced to thereby improve electrical properties.

As set forth above, in a group III nitride semiconductor manufactured by the method according to exemplary embodiments of the invention, a laser beam is irradiated onto a second surface with a nitrogen polarity opposing a first surface with a group III element polarity so that the second surface is changed to have an identical polarity to the first surface. This allows the opposing surfaces of the group III nitride semiconductor to have an identical group III element polarity.

When a semiconductor structure such as a light emitting device is manufactured using a second surface surface-treated to have a group III polarity in a group III nitride semiconductor, the light emitting device is improved in crystallinity and thus enhanced in light emitting efficiency.

Moreover, when the group III nitride semiconductor is re-grown using the second surface surface-treated to have a group III polarity, a re-growth layer with superior surface flatness can be formed.

Also, when an electrode is formed on the second surface surface-treated to have a group III polarity of the group III nitride semiconductor, an ohmic contact resistance at a contact surface is reduced to improve electrical properties.

While the present invention has been shown and described in connection with the exemplary embodiments, it will be apparent to those skilled in the art that modifications and variations can be made without departing from the spirit and scope of the invention as defined by the appended claims.

What is claimed is:

1. A group III nitride semiconductor including a first surface having a group III polarity and a second surface opposing the first surface, the group III nitride semiconductor comprising:
   a polarity inversion layer corresponding to an area of the group III nitride semiconductor layer located along the second surface, and formed to be continuous with the other area of the group III nitride semiconductor layer, the polarity inversion layer having a crystal arrangement of the other area inversed such that the second surface has a group III polarity identical to a polarity of the first surface.

2. The group III nitride semiconductor of claim 1, wherein the polarity inversion layer has a thickness of 5 to 2000 nm.

3. The group III nitride semiconductor of claim 1, wherein the area corresponding to the polarity inversion layer has a composition identical to a composition of the other area.

4. The group III nitride semiconductor of claim 1, wherein the group III nitride semiconductor is a semiconductor represented by AlxInyGa(1-x-y)N, where $0 \leqq x \leqq 1$, $0 \leqq y \leqq 1$, and $0 \leqq x+y \leqq 1$.

5. The group III nitride semiconductor of claim 1, wherein the group III nitride semiconductor is a GaN semiconductor, and
the group III polarity is a gallium polarity.

6. A group III nitride semiconductor structure comprising:
a first group III nitride semiconductor including a first surface having a group III polarity and a second surface opposing the first surface; and
a second group III nitride semiconductor formed on the second surface of the first group III nitride semiconductor,
wherein the first group III nitride semiconductor comprises a polarity inversion layer corresponding to an area of the first group III nitride semiconductor layer located along the second surface, and formed continuously with the other area of the first group III nitride semiconductor, the polarity inversion layer having a crystal arrangement of the other area inversed such that the second surface has a group III polarity identical to a polarity of the first surface.

7. The group III nitride semiconductor structure of claim 6, wherein the polarity inversion layer has a thickness of 5 to 2000 nm.

8. The group III nitride semiconductor structure of claim 6, wherein the area corresponding to the polarity inversion layer has a composition identical to a composition of the other area of the first group III nitride semiconductor.

9. The group III nitride semiconductor structure of claim 8, wherein the second group III nitride semiconductor has a composition different from a composition of the first group III nitride semiconductor or a conductivity type different from a conductivity type of the first group III nitride semiconductor.

10. The group III nitride semiconductor structure of claim 9, wherein the second group III nitride semiconductor comprises a plurality of group III nitride semiconductor layers each including an active layer, and
the group III nitride semiconductor structure comprises a semiconductor light emitting device.

11. The group III nitride semiconductor structure of claim 6, wherein the first group III nitride semiconductor is a semiconductor represented by AlxInyGa(1-x-y)N, where $0 \leqq x \leqq 1$, $0 \leqq y \leqq 1$, and $0 \leqq x+y \leqq 1$.

12. The group III nitride semiconductor structure of claim 6, wherein the first group III nitride semiconductor is a GaN semiconductor, and
the group III polarity is a gallium polarity.

* * * * *